(12) United States Patent
McBride et al.

(10) Patent No.: US 10,228,399 B2
(45) Date of Patent: Mar. 12, 2019

(54) CONFIGURABLE SMART SENSOR SYSTEMS

(71) Applicant: Simmonds Precision Products, Inc., Vergennes, VT (US)

(72) Inventors: Benjamin D. McBride, South Burlington, VT (US); Peter J. Carini, Underhill, VT (US); Matthew B. Burleigh, Essex, VT (US); Travis Gang, Hinesburg, VT (US); Joel Nelson, Winooski, VT (US)

(73) Assignee: Simmonds Precision Products, Inc., Vergennes, VT (US)

( * ) Notice: Subject to any disclaimer, the term of this patent is extended or adjusted under 35 U.S.C. 154(b) by 0 days.

(21) Appl. No.: 15/404,880

(22) Filed: Jan. 12, 2017

(65) Prior Publication Data

US 2018/0196089 A1    Jul. 12, 2018

(51) Int. Cl.
*G01R 19/25* (2006.01)
*H03M 1/10* (2006.01)
*H04L 29/08* (2006.01)
*H03M 1/12* (2006.01)
*H03M 1/66* (2006.01)

(52) U.S. Cl.
CPC ...... *G01R 19/2506* (2013.01); *H03M 1/1009* (2013.01); *H04L 67/12* (2013.01); *H03M 1/12* (2013.01); *H03M 1/66* (2013.01)

(58) Field of Classification Search
CPC .............. G01R 19/25; G01R 29/2506; G01R 31/3167; G01R 19/16528; G01R 31/3172; G01R 31/31723; G01R 31/31926; G01R 35/00; G01R 35/005; H03M 1/001; H03M 1/004; H03M 1/12; H03M 1/182; H03M 1/46; H03M 1/66; H03M 1/1205; H03M 1/1215; H03M 1/1225; H03M 1/10; H03M 1/1004; H03M 1/1009
See application file for complete search history.

(56) References Cited

U.S. PATENT DOCUMENTS

| 8,009,078 | B1 | 8/2011 | Alley |
| 8,054,208 | B2 | 11/2011 | Fletcher et al. |
| 8,373,586 | B2 | 2/2013 | Alley et al. |
| 8,704,693 | B1 | 4/2014 | Clemens et al. |
| 8,742,968 | B2 | 6/2014 | Quiquempoix |

(Continued)

FOREIGN PATENT DOCUMENTS

| CN | 102890477 B | 11/2014 |
| EP | 2999120 A2 | 3/2016 |

OTHER PUBLICATIONS

Extended European Search Report, dated May 18, 2018, in corresponding European Patent Application No. 18151382.1.

*Primary Examiner* — Son T Le
(74) *Attorney, Agent, or Firm* — Locke Lord LLP; Daniel J. Fiorello; Scott D. Wofsy (57) ABSTRACT

A smart sensor system can include one or more configurable input and output channels, each configurable channel including one or more switches configured to activate the input and/or output and/or to select a type of input and/or output signal, at least one analog-to-digital converter and at least one digital-to-analog converter operatively connected to the one or more switches for the one or more configurable channels, and at least one controller configured to control the configurable channels.

17 Claims, 8 Drawing Sheets

(56) References Cited

U.S. PATENT DOCUMENTS

| | | |
|---|---|---|
| 9,013,343 B2 | 4/2015 | Ramachandran |
| 9,250,299 B1 | 2/2016 | Yarlagadda et al. |
| 2005/0128475 A1* | 6/2005 | Imura .................. G01J 1/08 |
| | | 356/300 |
| 2009/0172242 A1* | 7/2009 | Piasecki .............. G06F 13/4208 |
| | | 710/317 |
| 2014/0200850 A1 | 7/2014 | Muldowney et al. |
| 2014/0361775 A1* | 12/2014 | Qiu .................. G01R 33/3664 |
| | | 324/309 |
| 2015/0234443 A1 | 8/2015 | Kulathumani et al. |
| 2015/0378954 A1 | 12/2015 | Field et al. |
| 2016/0047708 A1 | 2/2016 | Rice et al. |

* cited by examiner

CONFIGURABLE SMART SENSOR SYSTEMS

BACKGROUND

1. Field

The present disclosure relates to smart sensors, more specifically to configurable smart sensor systems.

2. Description of Related Art

Sensors that have the capability to perform local digitization and processing are known as digital or smart sensors. Smart sensors are specific to a given analog sensor type due to the analog front end that interfaces with the analog sensor. Existing devices such as this are only capable of interfacing with a specific predetermined sensor.

Such conventional methods and systems have generally been considered satisfactory for their intended purpose. However, there is still a need in the art for improved smart sensor systems. The present disclosure provides a solution for this need.

SUMMARY

A smart sensor system can include one or more configurable input and output channels, each configurable channel including one or more switches configured to activate the input and/or output and/or to select a type of input and/or output signal, at least one analog-to-digital converter and at least one digital-to-analog converter operatively connected to the one or more switches for the one or more configurable channels, and at least one controller configured to control the configurable channels.

The one or more switches can be configured to control the input and/or output configurable channel impedance. The one or more switches can be configured to change the input and/or output analog filter for a given configurable channel.

The one or more switches can be configured to cause the one or more input channels to selectively process known voltages for internal calibration purposes and/or to selectively process a number of output channels for internal calibration purposes. The one or more configurable channels can include a programmable gain amplifier (PGA) in electrical communication with one or more configurable channels.

A switching regulator is configured to regulate the supply voltage for the one or more configurable output channels. The at least one controller can be further configured to receive the digital output and provide information associated with the received digital output to at least one external device.

In accordance with at least one aspect of this disclosure, a smart sensor system can include one or more configurable input channels, each configurable input channel including, one or more switches configured to activate the input channel and/or to select a type of input signal, at least one analog-to-digital converter (ADC) configured to convert one or more signals from one or more input channels, and at least one programmable logic device (PLD) configured to control the operation of the one or more switches for the one or more input channels.

At least one switch can be configured to allow an input channel to be connected to an output channel to configure an input/output channel. The one or more switches can be configured to control the configurable input channel impedance.

One or more switches can be configured to change the analog filter for a given configurable input channel. The one or more switches can be configured to cause the one or more input channels to selectively process known voltages for internal calibration.

The one or more channels can include a programmable gain amplifier (PGA) in electrical communication with one or more configurable channels. The at least one controller can be further configured to receive the digital output and provide information associated with the received digital output to at least one external device.

In accordance with at least one aspect of this disclosure, a smart sensor system can include one or more configurable output channels, each configurable output channel including one or more switches configured to activate the output and/or to select a type of output signal, at least one digital-to-analog converter is used for the one or more outputs, and at least one controller configured to control the one or more configurable output channels.

The one or more switches can be configured to allow the one or more output channels to be connected to one or more input channels to configure an input/output channel. The one or more switches can be configured to control the output configurable channel impedance.

The one or more switches can be configured to change the output analog filter for a given configurable channel. A switching regulator can be configured to regulate the supply voltage for the configurable output channel. The at least one controller can be further configured to receive digital input and provide information associated with the output to at least one external device.

In accordance with at least one aspect of this disclosure, a smart sensor system, comprising a configurable smart sensor interface having at least one of a configurable analog input or a configurable analog output, wherein the configurable smart sensor interface includes at least one terminal for connecting an analog sensor to the configurable analog input and/or the configurable analog output, and a controller configured to change an analog input type of the configurable analog input and/or an analog output type of the configurable analog output to operatively connect to an analog sensor type such that the configurable smart sensor interface can be used with a plurality of analog sensor types.

The configurable interface can include a programmable gain amplifier (PGA) in electrical communication with the at least one terminal. The configurable interface can include an input switch configured to select between a plurality of input channels, wherein the input switch is connected to at least one terminal at an input channel. The input switch can be a dual 4:1 MUX. An output of the input switch can be connected to the PGA. In certain embodiments, the output of the input switch can be connected to a resistor switch system in parallel with the PGA to measure current and/or voltage.

The configurable interface can include an analog-to-digital converter (ADC), wherein the PGA is operatively connected to the ADC. The configurable interface can include a low pass filter (e.g., before the ADC, disposed between the PGA and the ADC). The configurable interface can include an ADC driver (e.g., disposed between the low pass filter and the ADC).

The system can include a signal conditioning circuit to provide an output current (e.g., constant current) and/or voltage (e.g., constant voltage) to a sensor that requires power or an excitation signal. The signal conditioning circuit can include one or more MOSFETS, one or more amplifiers, and one or more digital to analog converters (DAC), for example. The MOSFETS can be P-channel MOSFETS or any other suitable type.

The signal conditioning circuit can be connected to the input switch at an input channel thereof for calibration of a DAC. The system can include field programmable gate array (FPGA) operative to control the configurable interface and/or one or more components (e.g., the PGA, the input switch, the resistor switch, the ADC, the DAC, the MOSFETS, or any other suitable component) thereof for controlling the analog input type.

In accordance with at least one aspect of this disclosure, a configurable smart sensor interface can include at least one of a configurable analog input or a configurable analog output, wherein the configurable smart sensor interface is configured to change an analog input type of the configurable analog input and/or analog output type of the configurable analog output to operatively connect to an analog sensor type such that the configurable smart sensor interface can be used with a plurality of analog sensor type.

In accordance with at least one aspect of this disclosure, a configurable smart sensor interface includes one or more configurable input and/or output channels, each configurable channel including one or more switches to activate the input and/or output and/or to select a type of input and/or output signal, at least one analog-to-digital converter (ADC) for the one or more inputs and/or at least one digital-to-analog converter (DAC) for the one or more outputs, and at least one controller configured to control the configurable channels.

The selected type of input signal can include at least one of DC and/or AC voltage input, DC and/or AC current input, or DC and/or AC charge input. The selected type of output signal can include at least one of DC and/or AC voltage output or DC and/or AC current output.

One or more of the switches can be used to control at least one of the input channel or output channel impedance. One or more switches can be used to configure the analog input filter and/or to control the voltage and/or current of the output channel.

Two terminals can be used for each configurable channel, however, any other suitable number is contemplated herein. The input channel can use the one or more switches to selectively process known voltages for internal calibration purposes and/or to selectively process a number of output channels for internal calibration purposes.

The one or more switches can allow the one or more configurable channels to be either an input and/or output channel. The interface can include a switching regulator configured to regulate the supply voltage for the output channel to reduce power loss through a voltage/current source circuit.

The interface can include a digital isolation barrier that is configured to electrically isolate the digital output. In certain embodiments, the interface can include a power isolation barrier that is configured to electrically isolate the power input. The interface can include an analog isolation barrier that is configured to electrically isolate the analog input. In certain embodiments, the interface can include a programmable gain amplifier (PGA), wherein the PGA is configured to process one or more signals provided to the ADC.

These and other features of the systems and methods of the subject disclosure will become more readily apparent to those skilled in the art from the following detailed description taken in conjunction with the drawings.

BRIEF DESCRIPTION OF THE DRAWINGS

So that those skilled in the art to which the subject disclosure appertains will readily understand how to make and use the devices and methods of the subject disclosure without undue experimentation, embodiments thereof will be described in detail herein below with reference to certain figures, wherein.

DETAILED DESCRIPTION

Figure 1A:
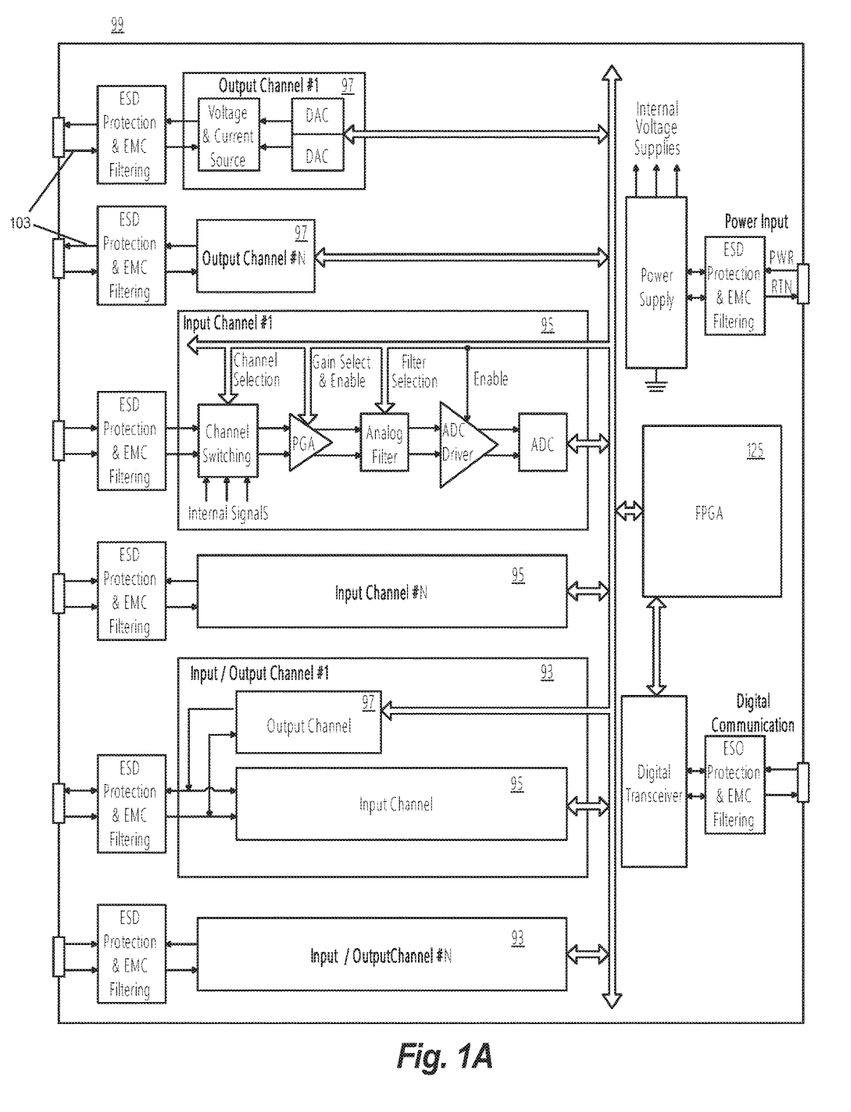
FIG. 1A is a schematic diagram of an embodiment of a system in accordance with this disclosure.

Reference will now be made to the drawings wherein like reference numerals identify similar structural features or aspects of the subject disclosure. For purposes of explanation and illustration, and not limitation, an illustrative view of an embodiment of a system in accordance with the disclosure is shown in FIG. 1A and is designated generally by reference character 99. Other embodiments and/or aspects of this disclosure are shown in FIGS. 1B-11. The systems and methods described herein can be used to allow use of a single device for multiple analog inputs, for example.

Referring to FIG. 1A, a generic embodiment of a smart sensor system 99 is shown. The smart sensor system 99 includes any suitable number of output channels 97 (e.g., output channels #1 through output channel #N as shown, where N can be any suitable number). Each output channel 97 can include a voltage and current controlled source and one or more DACs as shown.

The system 99 can include one or more input channels 95 (e.g., input channel #1 through input channel #N, where N can be any suitable number). The input channels 95 can include any suitable components (e.g., one or more channel switching devices, a programmable gain amplifier (PGA), an analog filter, an ADC driver, and an Analog to Digital converter (ADC) as shown in FIG. 1A).

The system 99 can also include one or more combination input/output channels 93 (e.g., input/output channel #1 through input channel #N, where N can be any suitable number). Each combination input/output channels 93 can include any suitable input channel 95 and any suitable output channel 97.

As shown, each input channel 95, each output channel 97, each input/output channel 93, and/or one or more components thereof can be controlled by the a controller 125 (e.g., a field programmable gate array (FPGA) as shown, a microcontroller, an ASIC, a PLD, a processor, etc.). The system 99 can also include any suitable receiver and/or transmitter operatively connected to the controller 125 (e.g., a digital transceiver as shown, a serial transceiver, etc.). The system 99 can also include a power supply connected to any suitable components of the system 99 as appreciated by one having ordinary skill in the art.

Accordingly, embodiments of a smart sensor system can include one or more configurable input and/or output channels, each configurable channel including one or more switches to activate the input and/or output and/or to select a type of input and/or output signal, at least one analog-to-digital converter (ADC) for the one or more inputs and/or at least one digital-to-analog converter (DAC) for the one or more outputs, and at least one controller configured to control the configurable channels.

The selected type of input signal can include at least one of DC and/or AC voltage input, DC and/or AC current input, or DC and/or AC charge input. The selected type of output signal can include at least one of DC and/or AC voltage output or DC and/or AC current output.

One or more of the switches can be used to control at least one of the input channel or output channel impedance. One or more switches can be used to configure the analog input filter and/or to control the voltage and/or current of the output channel.

Two terminals can be used for each configurable channel. The input channel can use the one or more switches to selectively process known voltages for internal calibration purposes and/or to selectively process a number of output channels for internal calibration purposes.

The one or more switches can allow the one or more configurable channels to be either an input and/or output channel. The system can include a switching regulator configured to regulate the supply voltage for the output channel to reduce power loss through a voltage/current source circuit.

The system 99 can include a digital isolation barrier that is configured to electrically isolate the digital output. In certain embodiments, the system can include a power isolation barrier that is configured to electrically isolate the power input. The system can include an analog isolation barrier that is configured to electrically isolate the analog input. In certain embodiments, the system can include a programmable gain amplifier (PGA), wherein the PGA is configured to process one or more signals provided to the ADC.

Figure 1B:
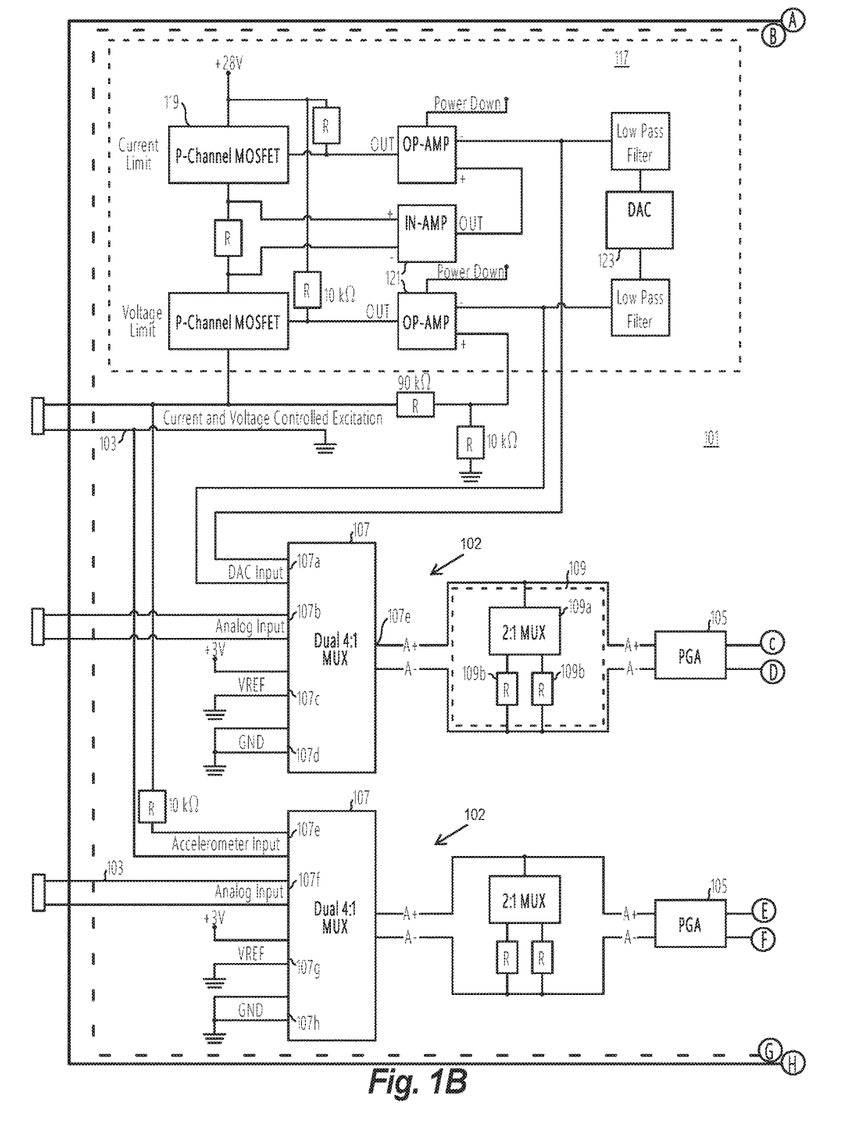
FIGS. 1B and 1C are a schematic diagram of an embodiment of a system in accordance with this disclosure.
Figure 1C:
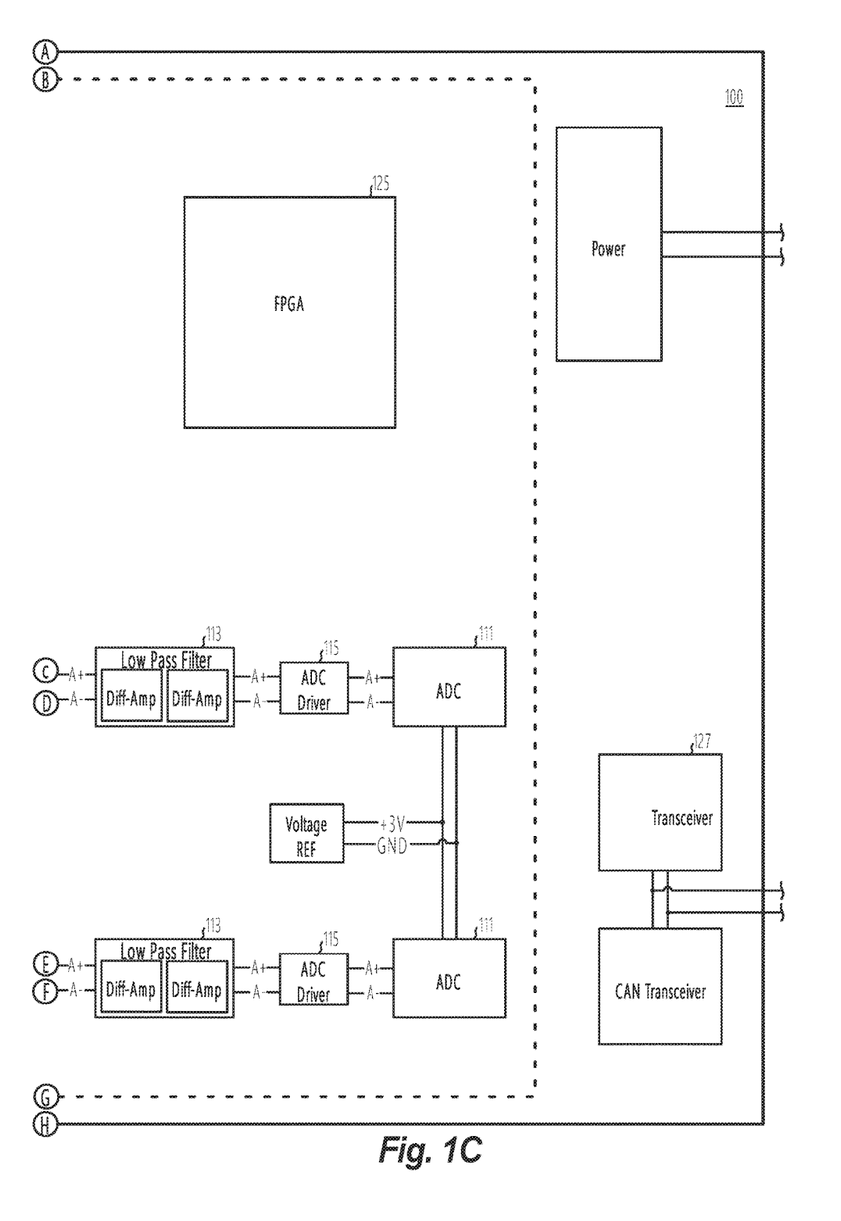

Referring to FIGS. 1B-1C, certain embodiments of a smart sensor 100 system includes a configurable interface 101 having one or more analog inputs 102 and/or outputs 117 and configured to change an analog input type to operatively connect to an analog sensor type such that the smart sensor 100 can be used with a plurality of analog sensor types. The configurable interface 101 can be configured to determine an input analog sensor type and to modify the analog input type to match the determined input sensor type.

The configurable interface 101 can include a programmable gain amplifier (PGA) 105 in electrical communication with the analog input 102, for example. The configurable interface 101 can include an input switch 107 (e.g., a multiplexer) configured to select between a plurality of input channels (e.g., channels 107a, 107b, 107c, 107d, 107e, 107f, 107g, 107h), for example. The input switch 107 can be connected to the at least one analog input 102 and/or output 117 at an input channel (e.g. channel 107b as shown). Also as shown, the input switch 107 can be a dual 4:1 multiplexer (MUX). Any other suitable switch with any suitable inputs and outputs is contemplated herein.

As shown, an output 107e of the input switch 107 can be connected to the PGA 105. In certain embodiments, the output 107e of the input switch 107 can be connected to a resistor switch system 109, e.g., in parallel with the PGA 105 to measure current and/or voltage. The resistor switch system 109 can include a switch 109a and a plurality of resistors 109b such that the switch 109a can select between the resistors 109b.

The configurable interface 101 can include an analog-to-digital converter (ADC) 111. The PGA 105 can be operatively connected to the ADC 111. In certain embodiments, the configurable interface 101 can include a low pass filter 113 disposed between the PGA 105 and the ADC 111. The configurable interface 101 can include an ADC driver 115 disposed between the low pass filter 113 and the ADC 111.

In certain embodiments, the output channel 117 can include a signal conditioning circuitry configured to supply a suitable current and/or a voltage (e.g., constant) to a sensor that requires power (e.g., via a terminal 103 as shown). The signal conditioning circuitry can include one or more switches (e.g., MOSFETS 119), one or more amplifiers 121, and/or one or more digital to analog converters (DAC) 123, for example. Any suitable circuitry is contemplated herein for powering and/or signal conditioning any suitable sensor. For example, the MOSFETS can be P-channel MOSFETS or any other suitable type.

The signal conditioning circuitry of the output channel 117 can be connected to the input switch 107 at an input channel thereof (e.g., for calibration of the DAC 123). In certain embodiments, certain sensors can use an excitation signal generated from system power by limiting the current and voltage (e.g., through two MOSFETs as shown). The analog representation of the current and voltage can be compared to the output of a DAC 123 and the difference can be used to control the MOSFETs.

The system 100 can include a controller 125 (e.g., a field programmable gate array (FPGA) or any other suitable controller) operative to control the configurable interface 101 and/or one or more components thereof (e.g., the PGA 105, the input switch 107, the resistor switch 109a, the ADC 111, the DAC 123, or any other suitable component) for controlling the analog input type of the system 100. The controller 125 can be manually or automatically controlled/modified to change what type of sensor can be input and used on one or more of the analog inputs and/or outputs 103.

For example, the controller 125 can select which channel of the input switch 107 is being used. The controller 125 can select the channel used (e.g., 107e for when a sensor needs a constant voltage and/or current source to function, channels 107b, 107f for non-powered analog inputs. The controller 125 can select one of channels 107c, 107d, 107g, 107h, for ground (GND) and or VREF, e.g., to calibrate the analog front end.

The controller 125 can control the state of the PGA 105 and the state of the amplifiers 121, for example. The controller 125 can control any suitable components of system 100 as appreciated by those having ordinary skill in the art, allowing on the fly configuration for use with any suitable input type.

The ADC 111 can be connected to the controller 125 in any suitable manner. After signal digitization by the ADC 111, the digital signal can be sent to the controller 125 which can allow for additional suitable signal processing as that performed by the configurable interface 101. Digital data can then be used for its ultimate purpose. For example, data can be stored and/or can be sent out (e.g., transmitted via a wired or wireless transceiver 127 to another location).

In certain embodiments, the system 100 can include a digital isolation barrier configured to electrically isolate the digital output. In certain embodiments, the system 100 can include a power isolation barrier that can be configured to electrically isolate the power input. In certain embodiments, the system 100 can include an analog isolation barrier that is configured to electrically isolate the analog input.

Figure 2A:
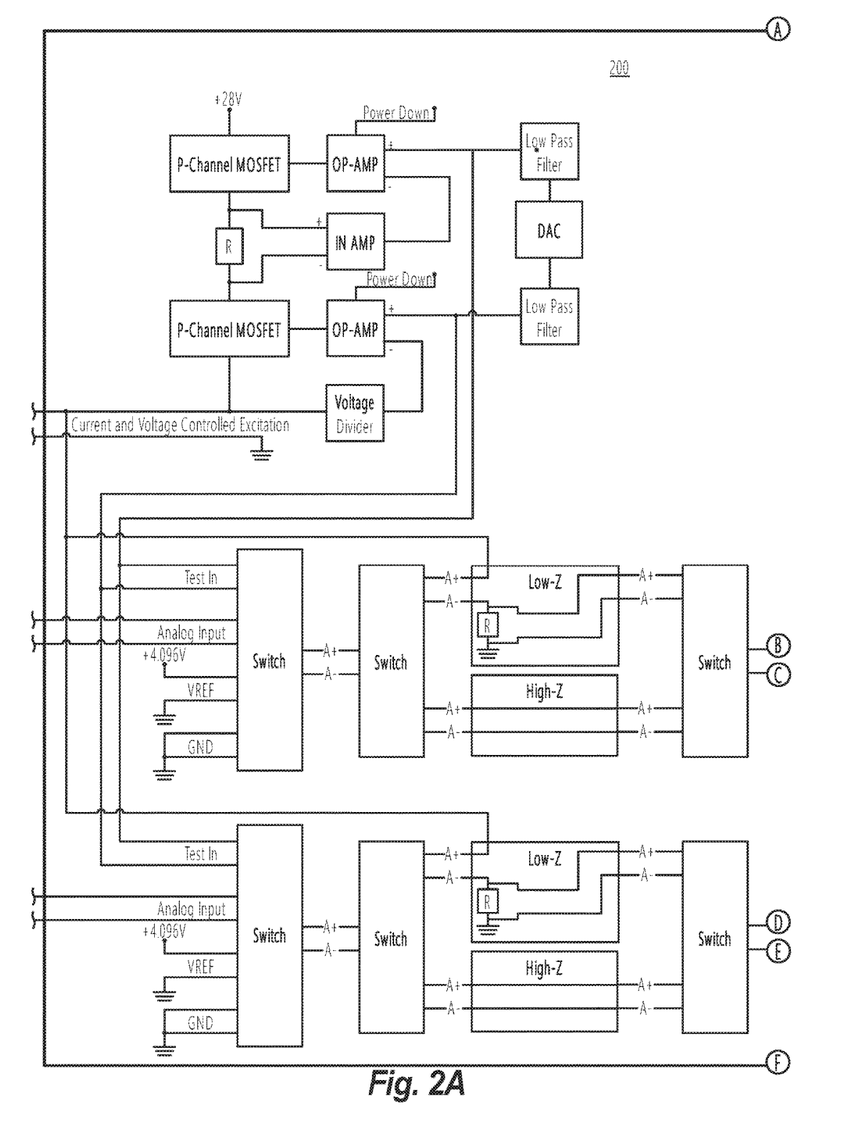
FIGS. 2A and 2B is a schematic diagram of an embodiment of a system in accordance with this disclosure.
Figure 2B:
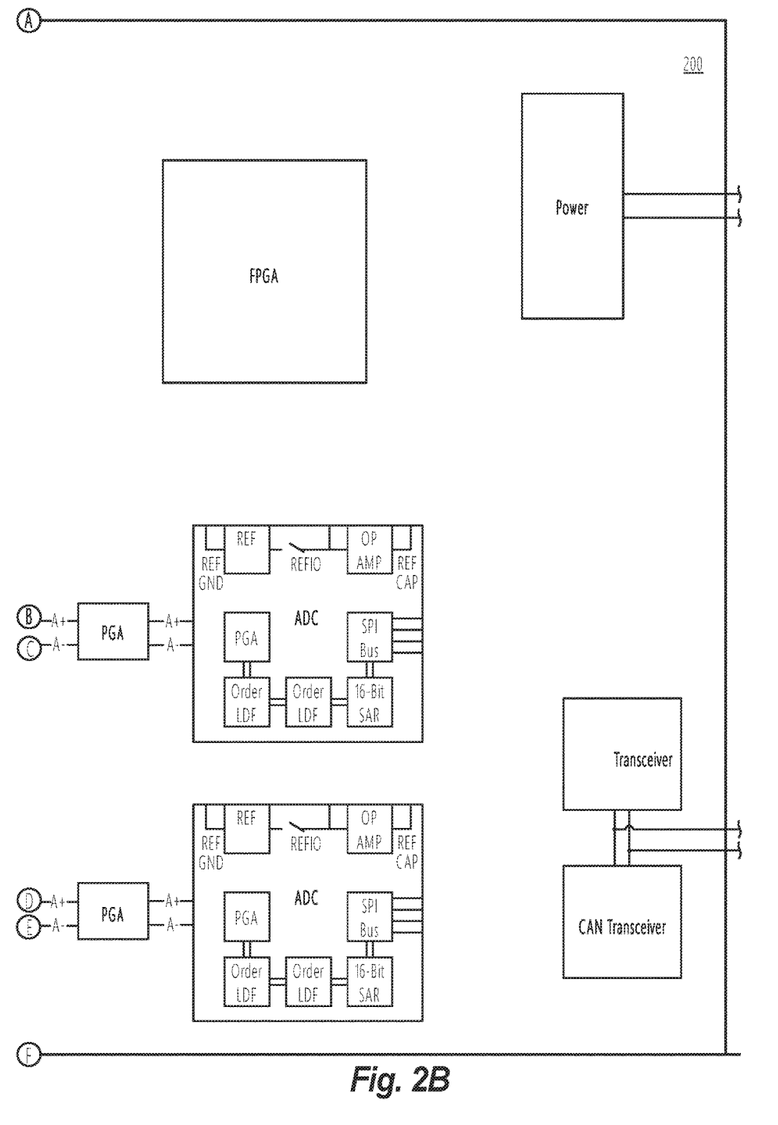

FIGS. 2A and 2B show another embodiment of a system 200 including a configurable interface. Any suitable circuitry configuration to allow a configurable interface is contemplated herein.

Figure 3:
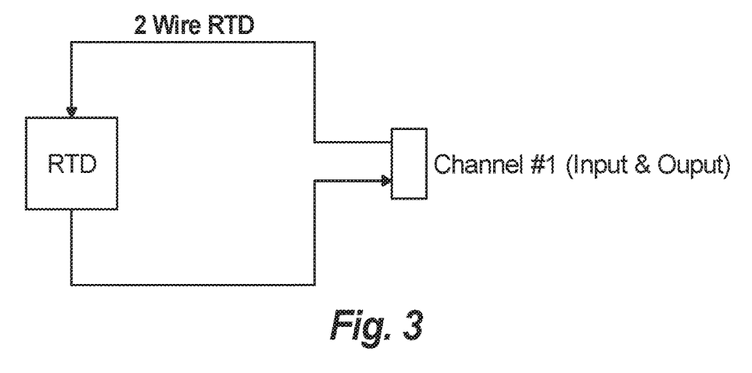
FIGS. 3-11 are schematic diagrams of embodiments of sensors connected to embodiments of a system as described herein.

Referring to FIGS. 3-11, various sensor connection schemes are shown connected to suitable a configurable system as described above in different states. As shown in FIG. 3, Channel #1 can provide a constant current and can also measure the voltage across the two terminals (e.g., for a 2 wire resistive temperature device (RTD)).

Figure 4:
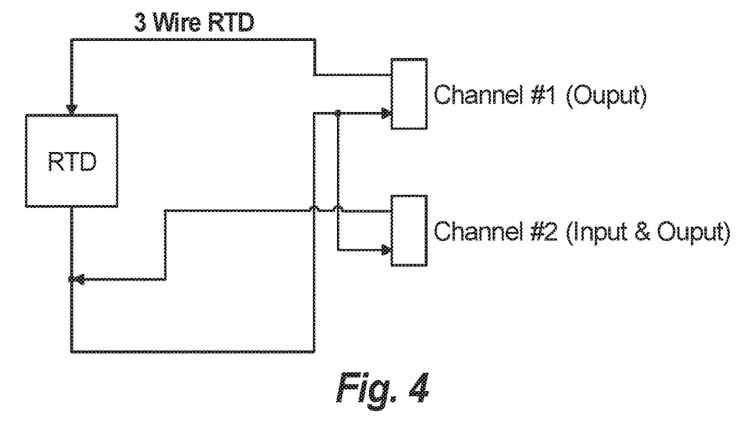

Referring to FIG. 4, for a 3 wire RTD, for example, Channel #1 can provide a constant current and can measure the voltage before the RTD. Channel #2 can provide a constant current and can measure the voltage after the RTD.

Figure 5:
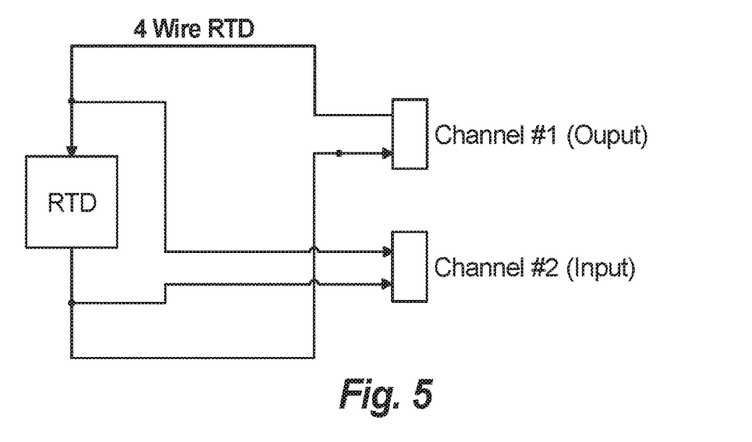

Referring to FIG. 5, for a 4 wire RTD, for example, Channel #1 can provide a constant current. Channel #2 can measure the voltage across the RTD.

Figure 6:
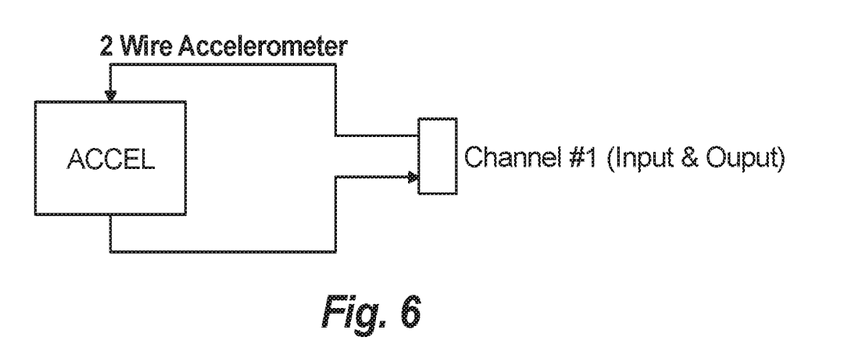

Referring to FIG. 6, for a 2 wire accelerometer, for example, Channel #1 can provide a constant current and can also measures the voltage across the two terminals.

Figure 7:
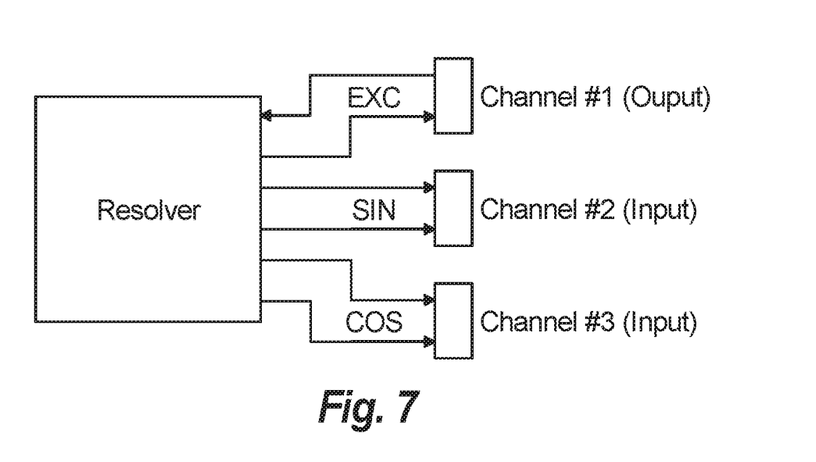

Referring to FIG. 7, for a differential transformer, for example, Channel #1 can provide a sinusoidal current. Channel #2 can measure the AC voltage and Channel #3 can measure the AC voltage.

Figure 8:
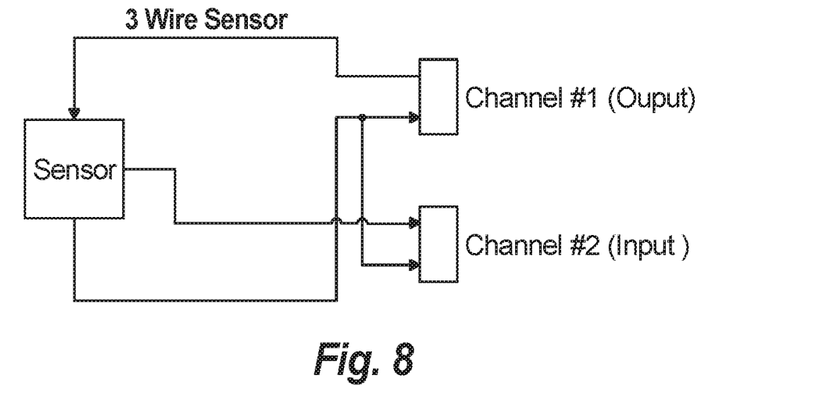
Figure 9:
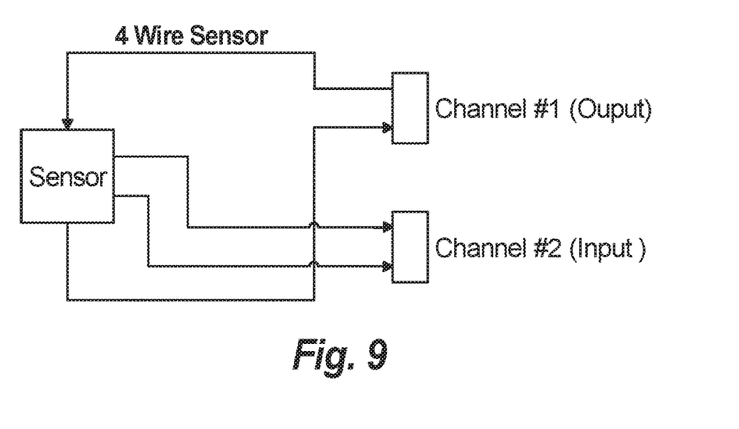

Referring to FIG. 8, for a 3 wire sensor, Channel #1 can provide a constant voltage and Channel #2 can measure the single ended voltage output from the sensor. Referring to FIG. 9, for a 4 wire sensor, Channel #1 can provide a constant voltage and Channel #2 can measure the differential voltage output from the sensor.

Figure 10:
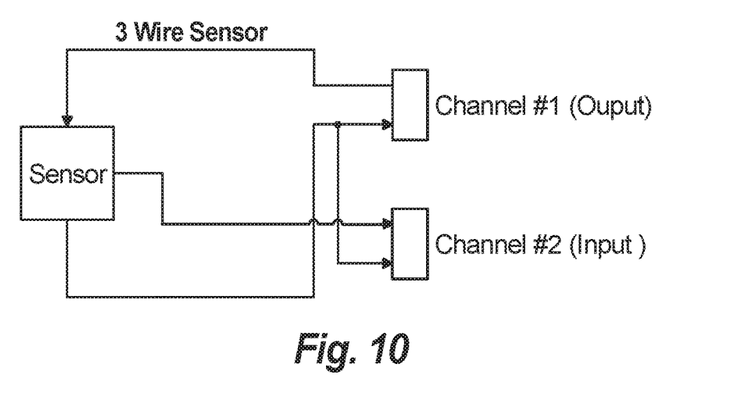
Figure 11:
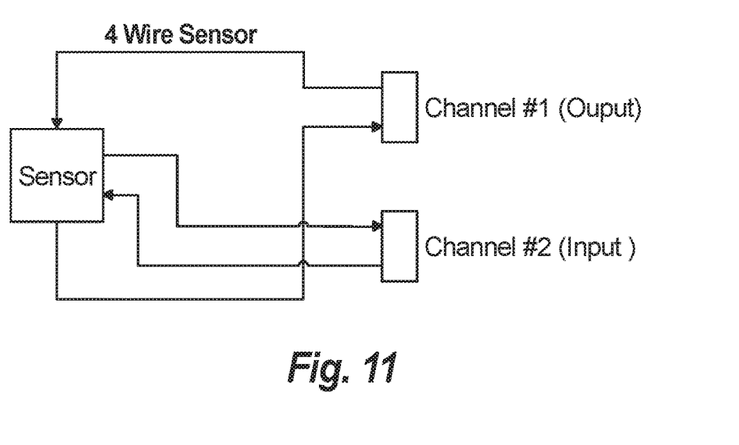

Referring to FIG. 10, for a 3 wire sensor, Channel #1 can provide a constant voltage and Channel #2 can measures the single ended current output from the sensor. Referring to FIG. 11, for a 4 wire sensor, Channel #1 can provide a constant voltage and Channel #2 can measure the differential current output from the sensor.

As described above, embodiments include a configurable Analog Front End (AFE) input/output circuit and can include any suitable number of configurable input and/or output channels, at least one ADC, and at least one controller for controlling the configurable channels (e.g., a Programmable Logic Device (PLD), and/or Application Specific Integrated Circuit (ASIC)). In embodiments, one or more input and/or output channels may include switches, configurable amplifiers, configurable attenuators and DACs to configure the AFE as desired.

Accordingly, embodiments include a smart sensor unit that is configurable to interface with a variety of different analog sensors. With a priori knowledge or a determination of sensors that are in the system, the FPGA hardware descriptive language (HDL) can be modified to control configurable elements to allow the system 100 to work with sensors. Alternately, the HDL can remain the same, and the FPGA control of configurable elements can be based on a configuration stored in memory or sent to the FPGA during operation. Embodiments also allow digitization at the point of connection as opposed to downstream electronics.

Embodiments allow a single piece of hardware to be used to connect a variety of analog sensor types to a digital bus with only changes to configuration. This greatly increases the flexibility to monitor a variety of systems at little cost.

The methods and systems of the present disclosure, as described above and shown in the drawings, provide for sensor systems with superior properties including a configurable interface. While the apparatus and methods of the subject disclosure have been shown and described with reference to embodiments, those skilled in the art will readily appreciate that changes and/or modifications may be made thereto without departing from the spirit and scope of the subject disclosure.

What is claimed is:

1. A smart sensor system, comprising:
   one or more configurable input and output channels, each configurable channel including:
      one or more first switches configured to activate the input and/or output and/or to select a type of input and/or output signal;
      one or more second switches connected to each first switch and configured to configured to select between a high impedance path and a low impedance path to control the input and/or output configurable channel impedance;
      at least one analog-to-digital converter and at least one digital-to-analog converter operatively connected to the one or more switches for the one or more configurable channels; and
      at least one controller configured to control the configurable channels.

2. The system of claim 1, wherein the one or more switches are configured to change the input and/or output analog filter for a given configurable channel.

3. The system of claim 1, wherein the one or more switches are configured to cause the one or more input channels to selectively process known voltages for internal calibration purposes and/or to selectively process a number of output channels for internal calibration purposes.

4. The system of claim 1, wherein the one or more configurable channels include a programmable gain amplifier (PGA) in electrical communication with one or more configurable channels.

5. The system of claim 1, comprising a switching regulator configured to regulate the supply voltage for the one or more configurable output channels.

6. The system of claim 1, wherein the at least one controller is further configured to receive the digital output and provide information associated with the received digital output to at least one external device.

7. A smart sensor system, comprising:
   one or more configurable input channels, each configurable input channel including:
   one or more first switches configured to activate the input channel and/or to select a type of input signal;
   one or more second switches connected to each first switch and configured to configured to select between a high impedance path and a low impedance path to control the input and/or output configurable channel impedance;
   at least one analog-to-digital converter (ADC) configured to convert one or more signals from one or more input channels; and
   at least one programmable logic device (PLD) configured to control the operation of the one or more switches for the one or more input channels.

8. The system of claim 7, wherein at least one switch is configured to allow an input channel to be connected to an output channel to configure an input/output channel.

9. The system of claim 7, wherein one or more switches are configured to change the analog filter for a given configurable input channel.

10. The system of claim 7, wherein the one or more switches are configured to cause the one or more input channels to selectively process known voltages for internal calibration.

11. The system of claim 7, wherein the one or more channels include a programmable gain amplifier (PGA) in electrical communication with one or more configurable channels.

12. The system of claim 7, wherein the at least one controller is further configured to receive the digital output and provide information associated with the received digital output to at least one external device.

13. A smart sensor system, comprising:
one or more configurable output channels, each configurable output channel including:
one or more first switches configured to activate the output and/or to select a type of output signal;
one or more second switches connected to each first switch and configured to configured to select between a high impedance path and a low impedance path to control the input and/or output configurable channel impedance;
at least one digital-to-analog converter is used for the one or more outputs; and
at least one controller configured to control the one or more configurable output channels.

14. The system of claim 13, wherein one or more switches are configured to allow the one or more output channels to be connected to one or more input channels to configure an input/output channel.

15. The system of claim 13, wherein the one or more switches are configured to change the output analog filter for a given configurable channel.

16. The system of claim 13, comprising a switching regulator configured to regulate the supply voltage for the configurable output channel.

17. The system of claim 13, wherein the at least one controller is further configured to receive digital input and provide information associated with the output to at least one external device.

* * * * *